United States Patent
Hu et al.

(10) Patent No.: US 6,194,315 B1
(45) Date of Patent: Feb. 27, 2001

(54) ELECTROCHEMICAL COBALT SILICIDE LINER FOR METAL CONTACT FILLS AND DAMASCENE PROCESSES

(75) Inventors: Yongjun Jeff Hu, Boise; Li Li, Meridian, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/293,212

(22) Filed: Apr. 16, 1999

(51) Int. Cl.[7] ............................................... H01L 21/44
(52) U.S. Cl. ..................... 438/683; 438/630; 438/651; 438/655; 438/658; 438/660; 438/664; 438/682; 438/686; 438/649; 438/656; 438/685
(58) Field of Search ..................... 438/630, 651, 438/655, 658, 660, 664, 682, 686, 649, 656, 683, 685

(56) References Cited

U.S. PATENT DOCUMENTS

| 4,378,628 | 4/1983 | Levinstein et al. | |
|---|---|---|---|
| 5,047,367 | 9/1991 | Wei et al. | |
| 5,427,981 | * 6/1995 | Choi | 438/683 |
| 5,529,953 | 6/1996 | Shoda | |
| 6,054,385 | * 4/2000 | Gardner et al. | 438/655 |
| 6,060,387 | * 5/2000 | Shepela et al. | 438/630 |

OTHER PUBLICATIONS

Wolf et al., Silicon Processing for the VLSI Era, vol. 2, Lattice Press, pp. 150–152, 1990.*

R. Iggulden, L. Clevenger, G. Costrini, D. Dubozinsky, R. Filippi, J. Gambino, C. Lin, F. Schnabel, S. Weber, L. Gignac, M. Ronay, "Dual damascene aluminum for 1–Gbit DRAMs," Solid State Technology, Nov. 1998, pp. 37–44.

Qi–Zhong Hong, Wei–Yung Hsu, Larry Ting, Girish Dixit, Robert Havemann, "High Pressure Aluminum–Plug Interconnects with Improved Electromigration by Microstructural Modifications," VMIC Conference, pp. 449–454 (Jun. 18–20, 1996).

* cited by examiner

Primary Examiner—John F. Niebling
Assistant Examiner—Lynne A. Gurley
(74) Attorney, Agent, or Firm—Knobbee, Martens, Olson & Bear, LLP.

(57) ABSTRACT

A liner material and method of use is disclosed. The method includes depositing a silicon layer into a deep void, such as a via or trench, and physical vapor depositing a cobalt seed layer onto the silicon. A supplemental cobalt layer is electroplated over the seed layer. The structure is then annealed, forming cobalt silicide ($CoSi_x$). The layer can be made very thin, facilitating further filling the via with highly conductive metals. Advantageously, the layer is devoid of oxygen and nitrogen, and thus allows low temperature metal reflows in filling the via. The liner material has particular utility in a variety of integrated circuit metallization processes, such as damascene and dual damascene processes.

21 Claims, 5 Drawing Sheets

ELECTROCHEMICAL COBALT SILICIDE LINER FOR METAL CONTACT FILLS AND DAMASCENE PROCESSES

BACKGROUND OF THE INVENTION

1. Field of the Invention

The present invention relates in general to protective metal silicides for use with integrated circuits and methods of making the same, and in particular to silicide liners between a via wall and a metal contact fill.

2. Description of the Related Art

When fabricating integrated circuits (IC), layers of insulating, conducting and semiconducting materials are deposited and patterned in sequence. Contact vias or holes are commonly formed in insulating materials known as interlevel dielectrics (ILDs). The vias are then filled with conductive material, thereby interconnecting electrical devices and wiring at various levels. Similarly, damascene processing involves etching trenches in insulating layers in a desired pattern for a wiring layer. These trenches are then filled with conductive material to produce the integrated wires. Where contact vias, extending downwardly from the bottom of the trenches, are simultaneously filled, the process is known as dual damascene.

Conductive elements, such as gates, capacitors, contacts, runners and wiring layers, must each be electrically isolated from one another for proper IC operation. In addition to interlevel dielectrics surrounding contacts, care must be taken to avoid conductive diffusion and spiking, which can cause undesired shorts between devices and contacts. Protective liners are often formed between via or trench walls and metals in a substrate assembly, to aid in confining deposited material within the via or trench walls. Liners are practically required for certain severe metal deposition processes, such as hot metal reflow and force-fill, particularly in damascene and dual damascene interconnect applications. Protective layers are similarly applied to transistor active areas and other circuit elements to which contacts are formed.

Candidate materials for protective layers should demonstrate good adhesion with materials on either side, such as via walls and metal fillers. Processes should be available for depositing the material with good step coverage into deep, high-aspect ratio vias or trenches. Perhaps most importantly, the liner should serve as an effective diffusion barrier. Typically, liners have been formed of metal nitrides, such as TiN, for which chemical vapor deposition (CVD) processes have been developed. As is known in the art, CVD is particularly well adapted to conformally depositing into deep vias and trenches.

Continued miniaturization of integrated circuits, in pursuit of faster and more efficient circuit operation, results in contact vias having ever higher aspect ratios (defined as the ratio of height to width of the via). Continued scaling of critical device dimensions leads to more narrow contacts, while contact height cannot be proportionately decreased. ILDs must be maintained at a adequate thickness to avoid short circuits and interlevel capacitance, which tends to tie up electrical carriers and slow signal propagation speed. Accordingly, the aspect ratios of contact vias and trenches inevitably increase as circuit designs are scaled down. As is known in the art, high aspect ratio vias and trenches are very difficult to fill conformally, that is, without forming keyholes which can adversely affect conductivity of the contacts.

A conformal liner effectively further increases the aspect ratio, by reducing the narrow width of the via without a proportionate reduction in height. With ever smaller available volume within contact vias, it is desirable to provide thinner via liners, which would not only facilitate filling the via, but would also leave more room for more highly conductive filler metals. Thinning the liner, however, generally reduces the liner's effectiveness in performing its general function of protecting against metal diffusion or spiking, due to the risk of incomplete via wall coverage and the ability of metals and contaminants to more easily diffuse through thin liners.

Conventional liner materials and processes for forming them have been found unsatisfactory for advanced generation fabrication technology, which dictates extremely high aspect ratios and attending harsh metallization processes.

Accordingly, there is a need for improved processes and materials for protective liners in contact vias and runner trenches. Desirably, such processes should also be compatible with conventional fabrication techniques, and thereby easily integrated with existing technology.

SUMMARY OF THE INVENTION

Briefly stated, the present invention provides a thin cobalt silicide layer and a method of forming such a layer as a liner within a high aspect ratio hole.

In accordance with one aspect of the invention, a method is provided for lining a hole, such as a via or a trench, in an integrated circuit. The method includes depositing a silicon layer into the hole. A cobalt seed layer is deposited onto the silicon layer within the hole, and a supplemental cobalt layer is electroplated onto the cobalt seed layer. Thereafter, the cobalt layers are reacted with the silicon layer to form a cobalt silicide liner along the hole sidewalls and floor.

Advantageously, the process creates a liner which can be used with a via having a high aspect ratio. Also, the liner is readily integrated with existing metallization technology, and particularly with newer hot metal and forcefill applications.

In accordance with another aspect of the present invention, a protective liner is provided between a highly conducting metal element in an integrated circuit and an interlevel dielectric. The liner includes a $CoSi_x$ layer with a thickness of less than about 300 Å.

In accordance with another aspect of the invention, a method is disclosed for forming a protective cobalt silicide layer in an integrated circuit. The method includes providing an undoped, amorphous silicon layer. A cobalt seed layer is deposited over the silicon layer by physical vapor deposition, and an additional cobalt layer electroplated over the cobalt seed layer. The cobalt is then reacted with the silicon layer.

BRIEF DESCRIPTION OF THE DRAWINGS

These and other aspects, features and advantages of this invention will be apparent from the detailed description of the preferred embodiment and the accompanying drawings, which are intended to illustrate and not to limit the invention. Like reference numerals are employed to designate like parts throughout the figures, wherein.

DETAILED DESCRIPTION OF THE PREFERRED EMBODIMENT

Figure 1:
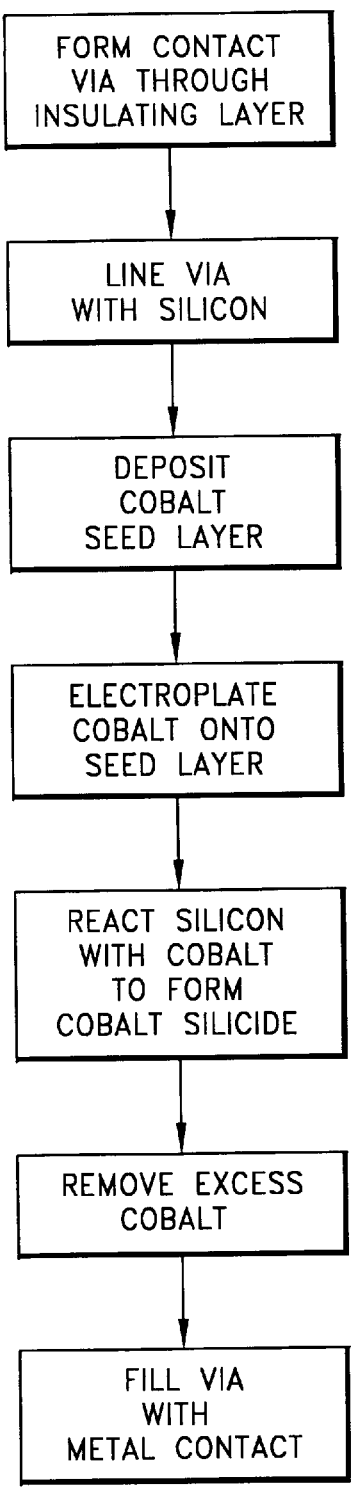
FIG. 1 is a flow diagram illustrating the basic steps of a process for forming a via or trench liner, in accordance with a preferred embodiment of the present invention.

The preferred embodiments are illustrated in the context of an integrated contact for electrically connecting a lower conductive circuit element to an upper wire or runner in an integrated circuit. The disclosed processes and materials have particular utility in the context of damascene and dual damascene metallization. The skilled artisan will readily appreciate, however, that the materials and methods disclosed herein will have application in a number of other contexts where thin conductive liners are desirable in high aspect ratio trenches or vias.

Conventional via or trench liners comprise metal nitrides, and most typically titanium nitride (TiN), for which effective CVD processes are known. Metal silicides are also employed in addition to or in place of metal nitrides, for more effective adhesion to insulating material of the via or trench sidewalls, and for lower contact resistivity with underlying circuit elements. Conventional metal nitrides and silicides, however, each demonstrate grain sizes of at least 200–300 Å. Nitridation of metal silicides to form metal silicon nitrides (e.g., $TiSi_xN_y$, $TaSi_xN_y$, $WSi_xN_y$) can reduce grain size from 30–40 nm (300–400 Å) to the nanometer or even amorphous range. Nevertheless, for effective liner function, conventional nitride or silicide liners need to be greater than about 500 Å, particularly for newer copper damascene, hot metal reflow, and metal forcefill processes. See, e.g., R. Iggulden et al., "Dual Damascene Aluminum for 1-Gbit DRAMs," SOLID STATE TECHNOLOGY (November 1998), p. 37; Z. Hong et al., "High Pressure Aluminum-plug Interconnects with Improved Electromigration by Microstructural Modification," VMIC PROCEEDINGS (Jun. 18–20, 1996), p. 449. Such liners occupy a considerable portion of vias in current and future generation circuit designs, making it difficult, if not impossible, to fill the lined vias with highly conductive metals.

Moreover, nitrogen or oxygen content in liners disadvantageously affects subsequent metallization processes. Aluminum, for example, effectively fills high aspect ratios when deposited slowly at high temperatures (e.g., about 450° C.) in hot metal reflow processes. High nitrogen or oxygen content, however, such as in metal nitride or metal silicon nitride liners, raises the reflow temperature considerably, increasing costs and risking thermally induced damage to lower integrated structures.

Cobalt silicide ($CoSi_x$) has the potential to serve as an effective via or trench liner due to several advantageous characteristics. As a fine grain material, with grain sizes as low as 50 Å to 70 Å, even very thin $CoSi_x$ layers form effective diffusion barriers, adequate to contain even fast-diffusing elements such as copper. Additionally, $CoSi_x$ can be formed with low oxygen and nitrogen content, facilitating subsequent lower temperature metal fills.

Unfortunately, satisfactory chemical vapor deposition (CVD) techniques have yet to be developed for $CoSi_x$. Unlike other metal halides, cobalt chlorides and cobalt fluorides are relatively nonvolatile, making deposition of $CoSi_x$ difficult with conventional CVD methods. Accordingly, conformal deposition techniques are required before $CoSi_x$ can serve as a realistic liner for present technology metallization.

FIG. 1 schematically illustrates a process flow for forming a conductive liner in accordance with a preferred embodiment of the invention. As shown, the process begins with formation of a contact via through an insulating layer. It will be understood that the same process may be applied to trenches, such as in damascene metallization process flows. The via is then lined with silicon and a thin cobalt seed layer applied to the lining silicon. A thicker layer of cobalt can then be electroplated onto the structure, followed by silicidation anneal. The underlying silicon is consumed in the process, to leave a cobalt silicide layer lining the insulating walls of the via. Excess elemental cobalt is then selectively removed from over the silicide, and the $CoSi_x$-lined via is filled with metal to complete the contact.

The process will now be described in detail with reference to FIGS. 2–8.

Figure 2:
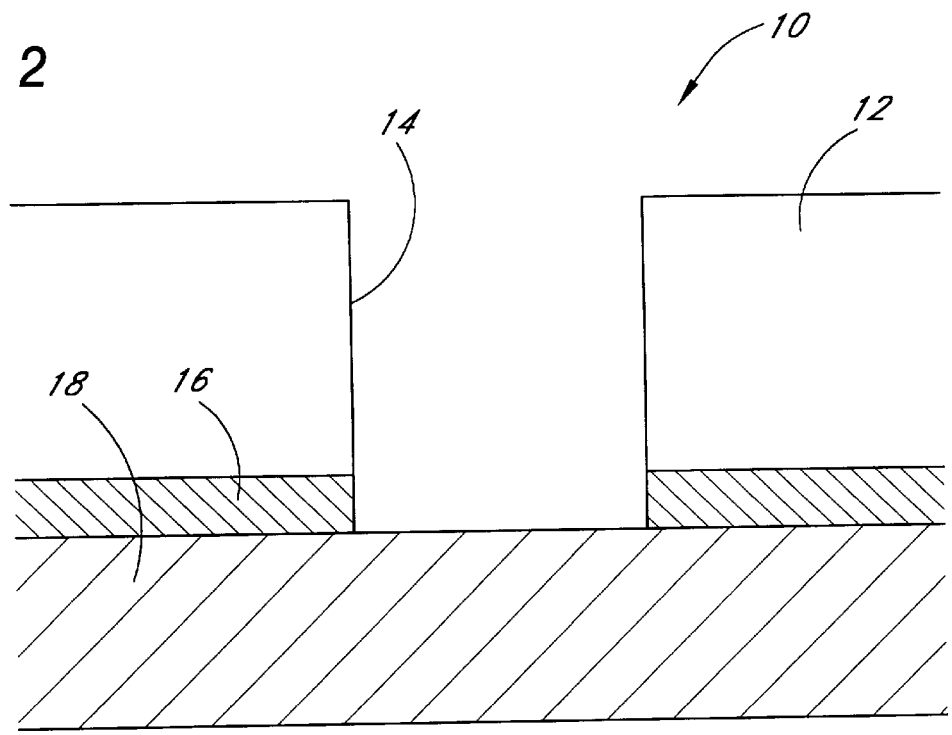
FIG. 2 is a partial elevational cross-section of a partially fabricated integrated circuit or substrate assembly, showing a conventional interlevel dielectric and a via therethrough, exposing a conductive circuit element beneath the via.

A partially fabricated integrated circuit or substrate assembly 10 is shown in FIG. 2. The structure is formed above a substrate (not shown), which may comprise a single-crystal wafer or other semiconductive layer in which active or operable portions of electrical devices are formed. An interlevel dielectric (ILD) 12 is formed above the substrate. Typical ILD materials include oxides formed from tetraethylorthosilicate (TEOS), borophosphosilicate glass (BPSG), polyamide, etc., and the illustrated ILD 12 comprises BPSG. The ILD 12 has a thickness adequate to electrically insulate underlying conductors from overlying conductors, which depends upon circuit design and operational parameters. In the illustrated embodiment, where the substrate assembly represents a 64 Mbit dynamic random access memory (DRAM) circuit, the ILD 12 is preferably between about 0.40 µm and 0.60 µm.

A contact via or hole 14 is etched through the ILD 12 to expose an underlying conductive circuit element. In the illustrated embodiment, the via 14 is narrow due to circuit design constraints. Preferably, the via 14 has a width of less than about 0.25 µm, more preferably less than about 0.20 µm, resulting in aspect ratios greater than about 0.5, preferably greater than about 8, and more preferably greater than about 10. Conventional photolithographic techniques may be employed to define the via 14, and anisotropic etching (e.g., reactive ion etching) is preferred for producing vertical via sidewalls.

The illustrated circuit element exposed by the etch comprises a contact landing pad of an underlying conductive runner or wiring layer 18. The conductive layer preferably comprises copper or aluminum, though the skilled artisan will appreciate that other conductive materials may be suitable, depending upon the function and desired conductivity of the circuit element. The illustrated embodiment preferably includes an antireflective layer 16 (e.g., TiN), through which the via 14 preferably extends.

Figure 3:
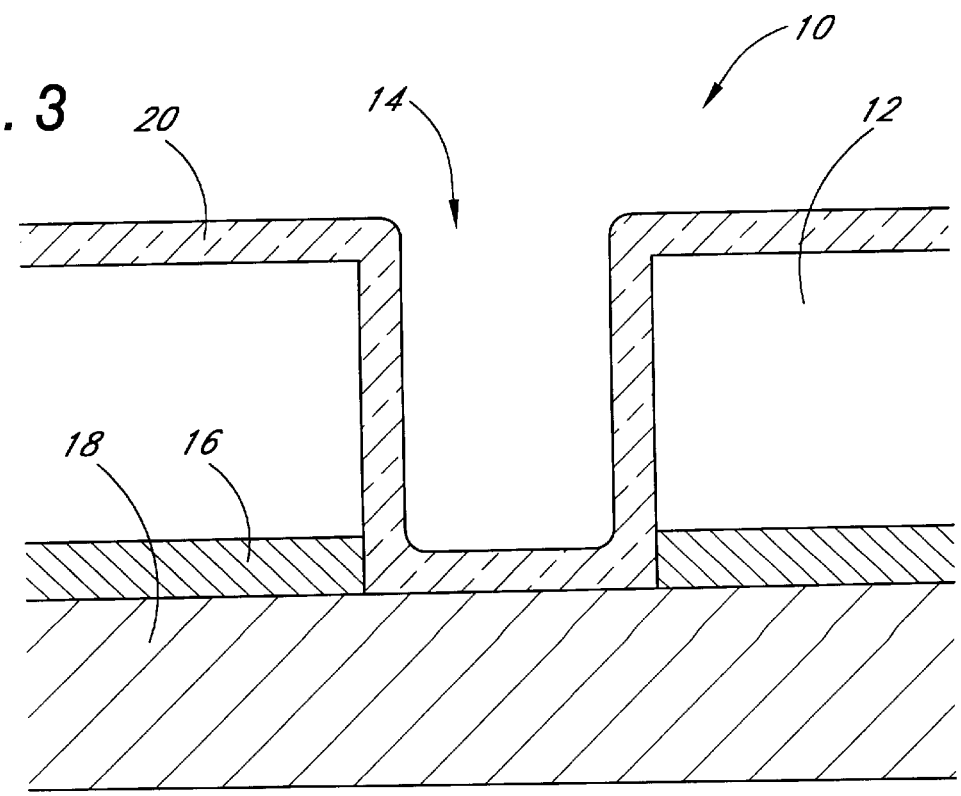
FIG. 3 shows the substrate assembly of FIG. 2 after deposition of a conformal silicon layer.

With reference to FIG. 3, a silicon layer 20 is then deposited over the substrate assembly 10 and into the sidewalls of the via 14. Preferably, the silicon layer is conformally deposited by low pressure chemical vapor deposition (LPCVD). Silicon source gas, such as silane (SiH$_4$), bubbled dichlorosilane (DCS) or trichlorosilane (TCS), are introduced into a reaction chamber. The silicon source gas reacts with the substrate assembly 10, which is mounted and heated within the chamber, to leave silicon at the surface. The illustrated silicon layer 20 is deposited at low temperatures, preferably between about 450° C. and 550° C. and more preferably about 505–525° C., such that the silicon layer 20 is amorphous. The amorphous silicon layer 20 is thus adequately conductive for the process purposes, without the need for complicated and limiting doping processes. The silicon layer 20 is relatively thin, preferably between about 50 Å and 500 Å, and more preferably less than about 300 Å, and most preferably between about 150 Å and 200 Å, depending upon the desired thickness of the CoSi$_x$ liner to be formed.

Figure 4:
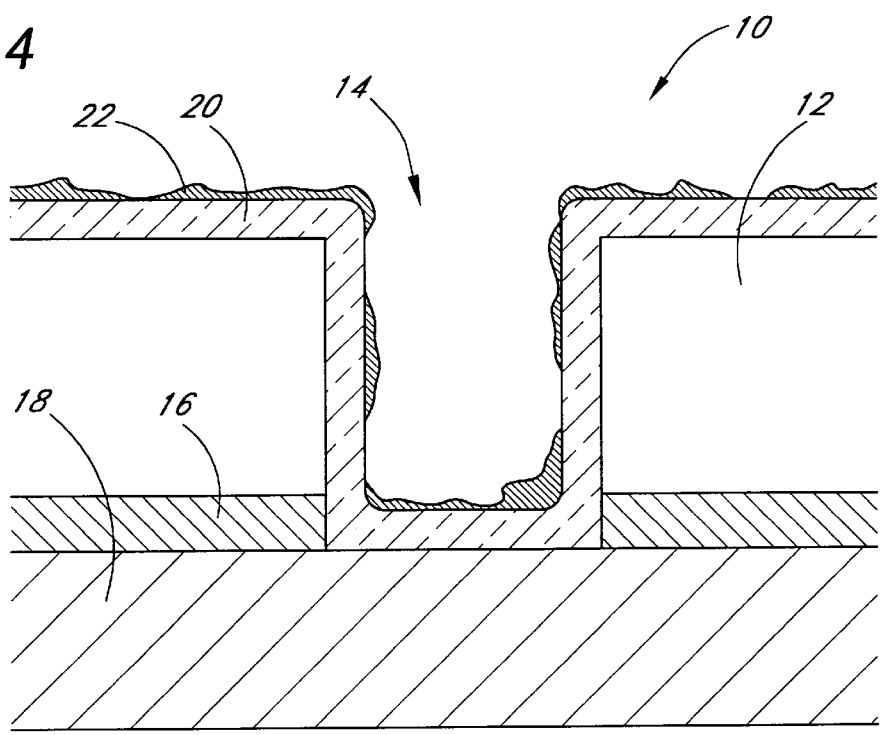
FIG. 4 shows the substrate assembly of FIG. 3 after deposition of a cobalt seed layer into the via and over the silicon layer.

Referring to FIG. 4, a cobalt seed layer 22 is deposited onto the silicon layer 20. In accordance with the illustrated embodiment, the seed layer 22 is very thin, preferably between about 5 Å to 150 Å, more preferably between about 50 Å and 100 Å, and need not be contiguous or fully cover the silicon layer 20. Only a small amount of cobalt needs to reach into the via 14, and particularly at the bottom of the via 14. Advantageously, therefore, the cobalt can be deposited by conventional physical vapor deposition.

In the preferred embodiment, cobalt deposition is accomplished by sputtering a pure cobalt target. For example, such sputtering may be carried out in an Endura 5500 PVD II™ processing chamber, commercially available from Applied Materials of Santa Clara, Calif. The illustrated cobalt layer 22 can be formed by sputtering in the exemplary chamber with an RF power of about 1 kW to 2 kW for about 8–12 seconds. The skilled artisan will readily appreciate that other deposition techniques may be equally viable.

Figure 5:
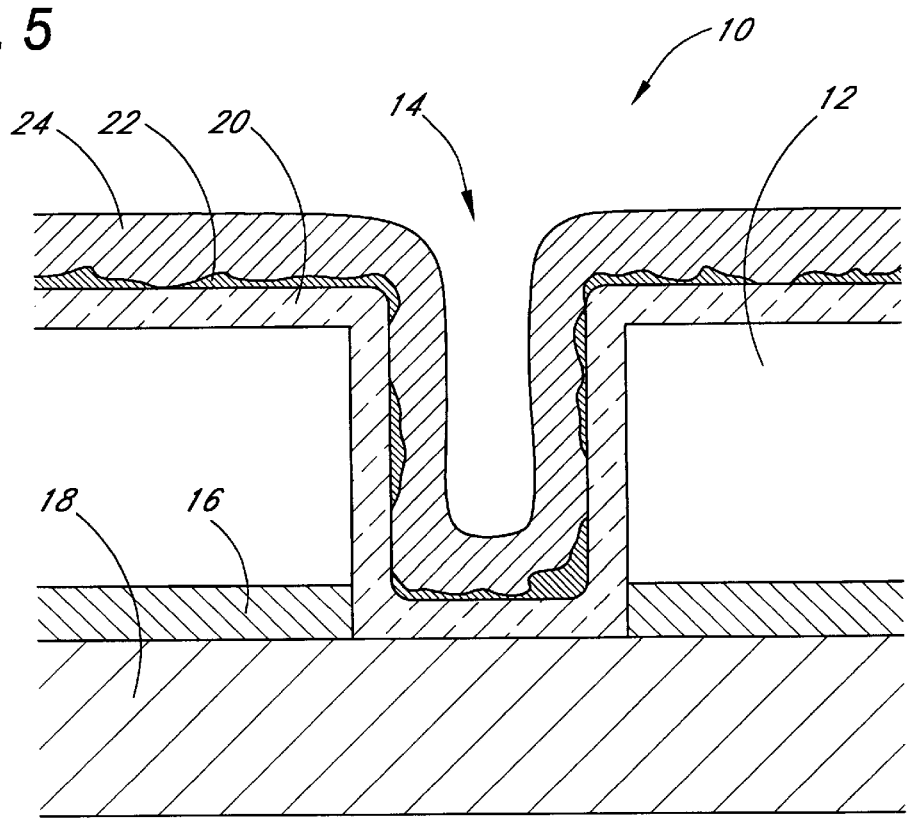
FIG. 5 shows the substrate assembly of FIG. 4 after electroplating of a fuller cobalt layer onto the seed layer.

Referring now to FIG. 5, after the seed layer 22 is deposited onto the layer 20, a supplemental cobalt layer 24 is deposited over the seed layer 22. Preferably, sufficient cobalt is provided, in combination with the seed layer 22, to fully consume the underlying silicon layer 20. Accordingly, in the illustrated embodiment, at least about 100 Å of cobalt is preferably deposited into the via 14, and more preferably between about 200 Å and 800 Å, with an exemplary target of about 500 Å.

Advantageously, the illustrated amorphous silicon layer 20 and cobalt seed layer 22 enable growth of the cobalt supplemental layer 24 by electroplating. Because electroplating ensures good coverage of all interior via 14 surfaces, and because the final liner thickness is limited by the thickness of the silicon layer 20, there is no real upper limit to the thickness of the supplemental layer 24. Accordingly, the supplemental layer 24 can be deposited to completely fill or overfill the via 14.

In the illustrated embodiment, formation of the supplemental layer 24 is achieved by immersing the substrate assembly 10 into a solution of cobalt and hydrochloric acid. Both chlorine and cobalt ionize in the solution, according to the following formula:

$$Co + 2HCl \rightarrow Co^{2+} + 2Cl^- + H_2 \quad \text{(Eq. 1)}$$

The cobalt ions receive electrons at the negatively biased substrate assembly 10, leaving elemental cobalt over the seed layer 22. Desirably, the chlorine ions do not attack any of the exposed materials, including silicon, silicon oxide, BPSG or other ILD material.

Figure 6:
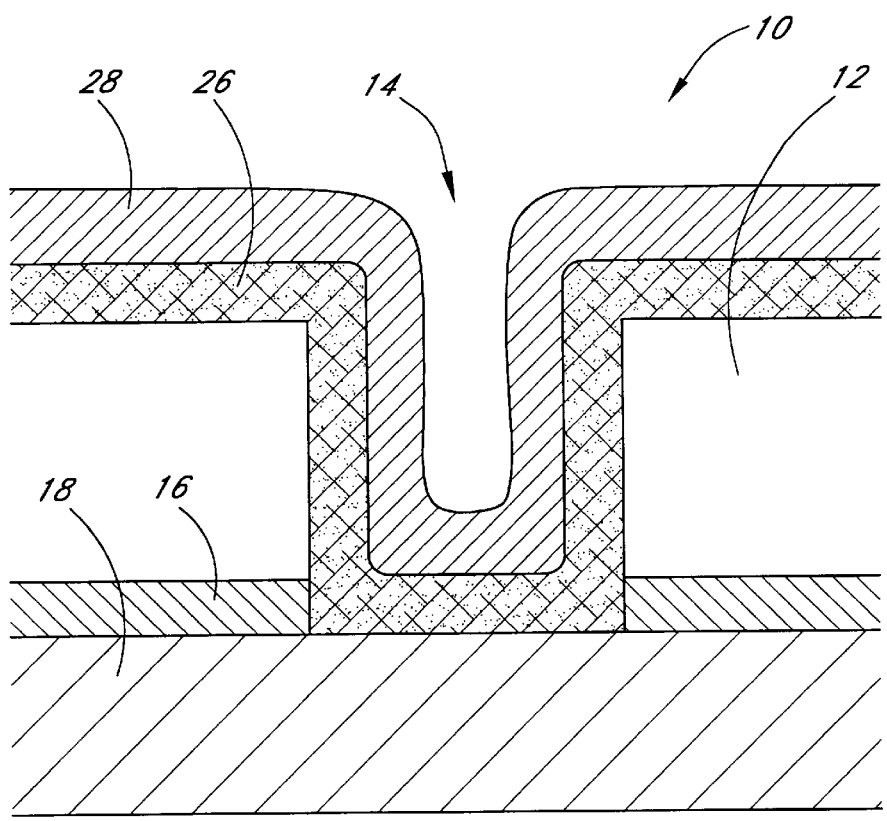
FIG. 6 shows the substrate assembly of FIG. 5 after an anneal step, forming a cobalt silicide liner.
Figure 7:
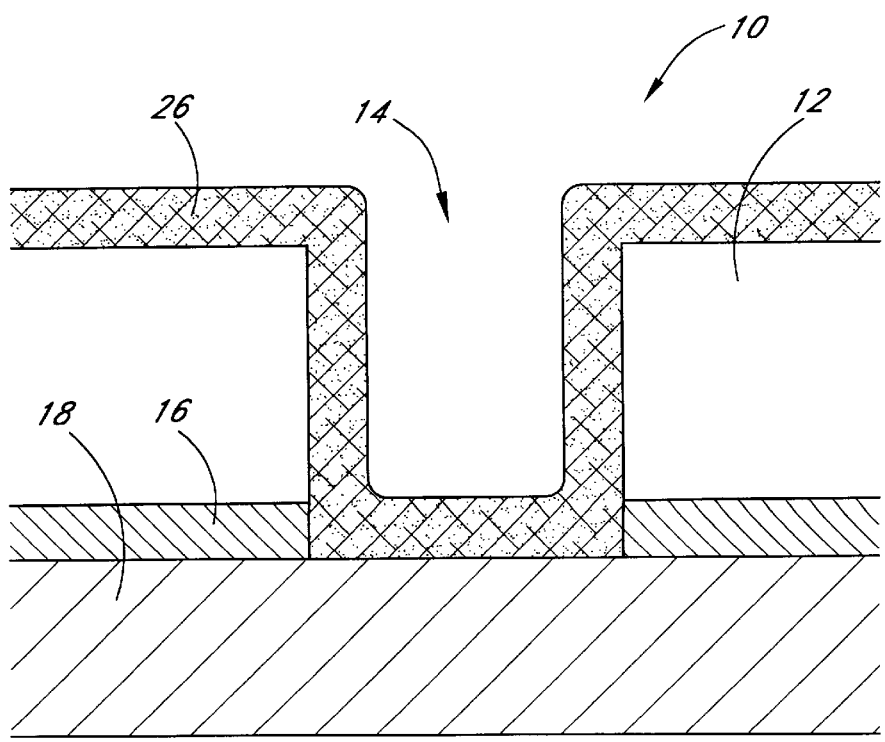
FIG. 7 shows the substrate assembly of FIG. 6 after excess elemental cobalt has been removed.

Referring to FIG. 6, after electroplating, the substrate assembly 10 is subjected to an anneal to react the silicon layer 20 with cobalt in the seed layer 22 and supplemental layer 24, forming a cobalt silicide liner 26. Preferably, the anneal is conducted at between about 450° C. and 850° C., and more preferably between about 600° C. and 650° C., for about 10–30 seconds, more preferably for about 20 seconds. The cobalt silicide layer 26 desirably has the form CoSi$_x$, where x is less than 2. Desirably, this material exhibits a lattice mismatch of less than about 3%. Accordingly, the silicide layer 26 is barely thicker than the silicon layer 20 consumed by the reaction. In accordance with the illustrated embodiment, therefore, the CoSi$_x$ layer 26 is preferably between about 50 Å and 500 Å, and more preferably less than about 300 Å, and most preferably between about 150 Å and 200 Å, As noted, the growth of the silicide is limited by the thickness of the silicon layer 20, such that a layer of unreacted or excess cobalt 28 typically remains over the silicide layer 26. As is well known in the art, the excess cobalt 28 can be removed by a selective metal etch, the result of which is shown in FIG. 7. The cobalt silicide layer 26 is left lining the walls of the via 14.

Figure 8:
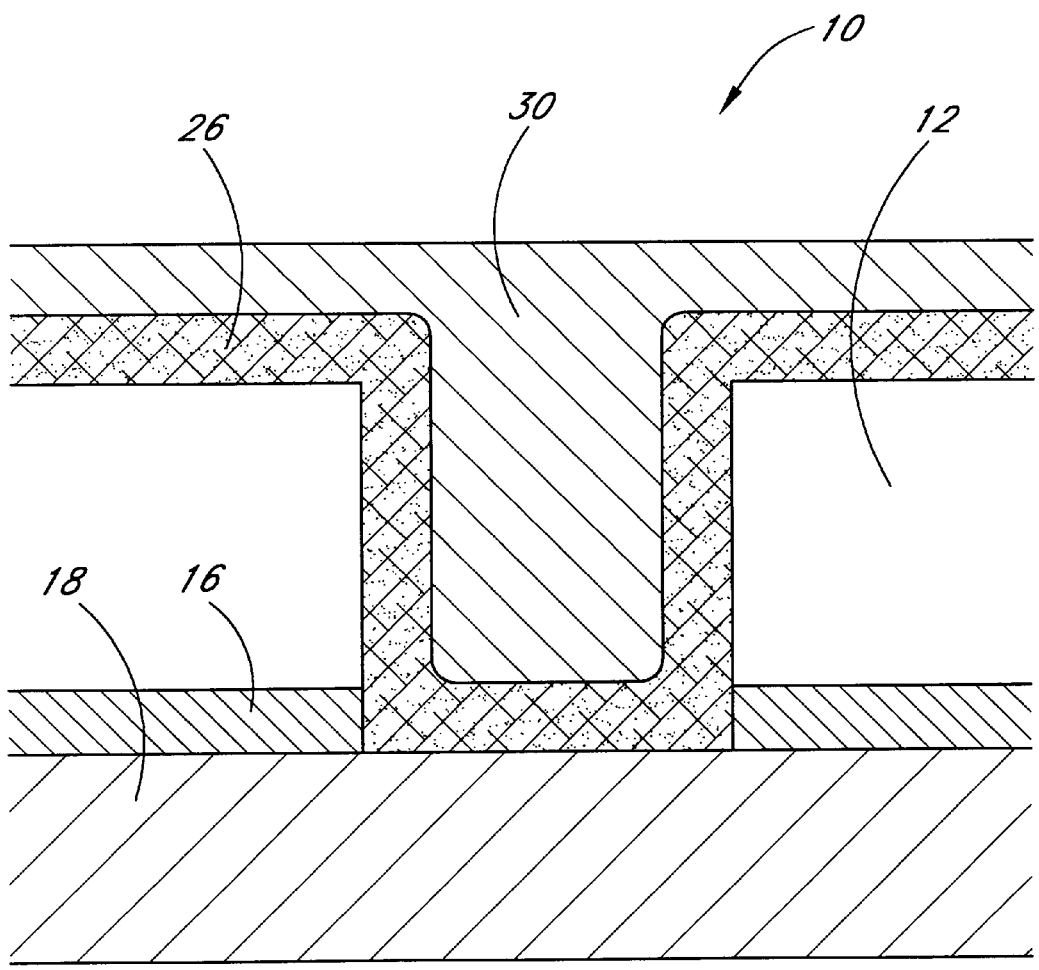
FIG. 8 shows the liner of FIG. 7 after the via has been filled with a highly conductive metal.

Referring to FIG. 8, after the etch forms the liner boundaries, the via 14 can be filled with a conductive metal filler 30, completing the contact and providing sufficiently high conductivity for signal propagation between the lower circuit element 16 and upper levels of wiring. Most preferably, the conductive metal filler 30 comprises copper, which is known to be highly conductive and inexpensive. Advantageously, the cobalt silicide liner 26 serves as a good barrier against copper diffusion. Other suitable metals include aluminum, Al/Cu alloy, Al/Ti alloy, Al/Si alloy, and Al/Ge alloy.

In recognition of the high aspect ratios of the via 14, the metal filler 30 of the illustrated embodiment comprises a metal deposited by hot metal reflow or forcefill processes. Hot metal reflow involves slow deposition of metal at close to the metal transition point (e.g., about 450° C. for aluminum), and is more fully described in R. Iggulden et al., "Dual Damascene Aluminum for 1-Gbit DRAMs," SOLID STATE TECHNOLOGY (November 1998), p. 37, the disclosure of which is incorporated herein by reference. Forcefill applications involve extremely high pressures (e.g., 200–300 atm.), literally forcing deposited metal into the via 14. Forcefill processes are more fully described in Z. Hong et al., "High Pressure Aluminum-plug Interconnects with Improved Electromigration by Microstructural Modification," VMIC PROCEEDINGS (Jun. 18–20, 1996), p. 449, the disclosure of which is incorporated herein by reference.

FIG. 8, it will be understood, is merely schematic. The contact formation may be planarized leave a contact plug, or it may be followed by photolithographic patterning and etching to define wiring layers in the portions of the cobalt silicide layer 26 and filler 30 above the ILD 12. More preferably, however, the inventive process is applied to the high aspect ratio vias and trenches employed in damascene or dual damascene constructions.

In accordance with dual damascene embodiments, the contact described above and illustrated in FIG. 8 extends from the bottom of a trench, which has been etched into an ILD in a desired wiring pattern. Specifically, after the ILD is etched to form trenches, the via 14 is etched from a trench floor down to a lower conductive element. The effective aspect ratio of the via 14 is thus particularly high.

The contact forming process described above is conducted on the via 14 and the trench (not shown) formed above the via 14. Thus, the cobalt silicide layer 26 lines both the via 14 and the walls of the overlying trench, and the metal filler 30 fills, and preferably overfills, both the via 14 and the overlying trench. The metal is subsequently planarized or etched back so that the metal 26, 30 remains isolated in paths within the trenches and vias.

Although this invention has been described in terms of a certain preferred embodiment and suggested possible modifications thereto, other embodiments and modifications may suggest themselves and be apparent to those of ordinary skill in the art are also within the spirit and scope of this invention. Accordingly, the scope of this invention is intended to be defined by the claims which follow.

We claim:

1. A method of lining a hole in an integrated circuit, comprising:
    depositing a silicon layer into a hole in an interlevel dielectric of a substrate assembly, the hole comprising sidewalls and a floor;
    depositing a cobalt seed layer onto the silicon layer within the hole;
    electroplating a supplemental cobalt layer onto the cobalt seed layer; and
    reacting the supplemental and seed cobalt layers with the silicon layer to form a cobalt silicide liner along the hole sidewalls and floor.

2. The method of claim 1, wherein the silicon layer comprises undoped silicon.

3. The method of claim 1, wherein the silicon layer comprises amorphous silicon.

4. The method of claim 3, wherein the silicon layer has a thickness between about 50 Å and 500 Å.

5. The method of claim 1, further comprising removing an unreacted portion of the supplemental cobalt layer after reacting the supplemental and seed cobalt layers with the silicon layer.

6. The method of claim 1, wherein depositing the cobalt seed layer comprises a physical vapor deposition.

7. The method of claim 6, wherein the cobalt seed layer has a thickness between about 5 Å and 150 Å.

8. The method of claim 1, wherein the cobalt seed layer has a thickness between about 50 Å and 100 Å.

9. The method of claim 1, wherein the seed layer is noncontiguous.

10. The method of claim 1, wherein depositing the cobalt seed layer comprises sputtering a cobalt target.

11. The method of claim 1, wherein the hole comprises a contact via through the interlevel dielectric.

12. The method of claim 11, wherein the via extends downwardly from the floor of a trench.

13. The method of claim 11, wherein electroplating the supplemental cobalt layer comprises immersing the via in a solution of cobalt and hydrochloric acid.

14. The method of claim 1, wherein the supplemental cobalt layer at least fills the hole.

15. The method of claim 1, wherein the cobalt silicide liner has a thickness of less than about 300 Å.

16. The method of claim 15, wherein the cobalt silicide liner has a thickness between about 150 Å and 200 Å.

17. The method of claim 1, wherein the hole has an aspect ratio greater than about 2.

18. The method of claim 17, wherein the hole has an aspect ratio greater than about 8.

19. The method of claim 18, wherein the hole has an aspect ratio greater than about 10.

20. A method of forming a protective cobalt silicide layer in an integrated circuit, the method comprising:
    providing an undoped, amorphous silicon layer;
    depositing a cobalt seed layer over the silicon layer by physical vapor deposition;
    electroplating an additional cobalt layer onto the cobalt seed layer; and
    reacting cobalt from the seed layer and the additional cobalt layer with the silicon layer.

21. The method of claim 20, wherein depositing the cobalt seed layer comprises sputtering a pure cobalt target.

* * * * *